(12) United States Patent
Tanaka et al.

(10) Patent No.: US 6,407,384 B1
(45) Date of Patent: Jun. 18, 2002

(54) ENERGY FILTER AND ELECTRON MICROSCOPE USING SAME

(75) Inventors: Michiyoshi Tanaka; Masami Terauchi, both of Miyagi; Katsushige Tsuno; Toshikazu Honda, both of Tokyo, all of (JP)

(73) Assignees: Jeol Ltd., Tokyo; Japan Science and Technology Corporation, Saitama; Michiyoshi Tanaka, Miyagi, all of (JP)

( * ) Notice: Subject to any disclaimer, the term of this patent is extended or adjusted under 35 U.S.C. 154(b) by 0 days.

(21) Appl. No.: 09/610,126

(22) Filed: Jul. 5, 2000

(30) Foreign Application Priority Data

Jul. 5, 1999 (JP) ......................................... 1999-190803

(51) Int. Cl.[7] .............................................. H01J 49/44
(52) U.S. Cl. ...................................... 250/305; 250/311
(58) Field of Search ................................ 250/305, 310, 250/396 R, 396 ML, 398, 311, 306

(56) References Cited

U.S. PATENT DOCUMENTS

| | | | | |
|---|---|---|---|---|
| 3,805,057 A | * | 4/1974 | Yanagisawa et al. | 250/49.5 |
| 3,979,590 A | * | 9/1976 | Andersen | 250/305 |
| 4,019,989 A | * | 4/1977 | Hazewindus et al. | 250/396 ML |
| 4,219,730 A | * | 8/1980 | Ishikawa et al. | 250/305 |
| 4,962,313 A | * | 10/1990 | Rose | 250/311 |
| 5,097,126 A | * | 3/1992 | Krivanek | 250/305 |
| 5,838,011 A | * | 11/1998 | Krijn et al. | 250/396 R |
| 6,111,253 A | * | 8/2000 | Tsuno | 250/311 |

FOREIGN PATENT DOCUMENTS

| | | | | |
|---|---|---|---|---|
| GB | WO 00/77504 A1 | * | 12/2000 | G01N/23/225 |
| JP | 59-837 | * | 1/1984 | H01J/37/10 |
| JP | 5-290800 | * | 10/1993 | H01J/49/48 |

OTHER PUBLICATIONS

"A double wienfilter as a high resolution, high transmission electron energy analyzer", W.H.J. Andersen et al., *Journal of Physics E: Scientific Instruments*, 1970, vol. 3, pp. 121–126.

* cited by examiner

*Primary Examiner*—Kiet T. Nguyen
(74) *Attorney, Agent, or Firm*—Webb Ziesenheim Logsdon Orkin & Hanson, P.C.

(57) ABSTRACT

There is disclosed an energy filter capable of reducing the Boersch effect. Also, an electron microscope using this energy filter is disclosed. This energy filter is composed of a first-stage energy filter and a second-stage energy filter arranged along the optical axis of an electron beam. The length $L_1$ of the first-stage filter is selected to be greater than the length $L_2$ of the second-stage filter. An energy-selecting slit is positioned in the electron beam path within the free space between the first- and second-stage filters. Each of these two stages of filters is a Wien filter having mutually perpendicular electric and magnetic fields.

7 Claims, 4 Drawing Sheets

ENERGY FILTER AND ELECTRON MICROSCOPE USING SAME

FIELD OF THE INVENTION

The present invention relates to an energy filter for selectively passing only charged particles having a given energy and to an electron microscope using such an energy filter.

DESCRIPTION OF THE PRIOR ART

In a transmission electron microscope (TEM), an electron beam is directed to a specimen. The image created by the electron beam transmitted through the specimen is enlarged and projected onto a fluorescent screen. Thus, a magnified image of the specimen is obtained on the fluorescent screen. In recent years, an electron microscope has been developed which has an energy filter such as an Ω-filter mounted within the electron optical system for projecting the electron beam transmitted through a specimen onto the fluorescent screen. In this instrument, a TEM image is created from only those of transmitted electrons affected by the specimen which have passed through the Ω-filter.

In this electron microscope equipped with this Ω-filter, the energy spread of the electron beam directed to the specimen must be narrowed in order to enhance the energy selectivity (energy resolution) of the obtained TEM image. Therefore, in this kind of electron microscope, a cold-type field emission gun (FEG) that provides the narrowest energy spread today is adopted.

However, with this type of field emission gun, the obtained energy spread is about 0.4 eV, for example, at an accelerating voltage of 200 kV. Currently, it is difficult to narrow the energy spread further. On the other hand, in order to obtain a higher energy resolution, it is desired to suppress the energy spread of the electron beam impinging on the specimen to approximately 0.1 to 0.2 eV or less. Accordingly, a new attempt has been recently made to narrow the energy spread. In particular, an energy filter is mounted between an electron gun and a specimen. A slit is used to extract a narrow energy range from an energy spread created by an electron source. This electron beam having a narrow energy spread is directed to the specimen.

However, a practical energy filter having a resolution sufficient to extract electron beams with energy spreads of approximately 0.1 to 0.2 eV from electron beams with an accelerating energy greater than 200 kV (at which electrons have an energy of 200 keV) required by a high-resolution electron microscope is not available today. Accordingly, a method of mounting an energy filter at a position where the electron beam is in a low energy state to perform an energy selection and then accelerating the electrons to impart high energy has been discussed.

Where a low-energy electron beam passes through an energy filter in this way, the Boersch effect must be taken into consideration. That is, the velocities (or energies) of electrons (generally, charged particles) traveling close to each other affect each other due to Coulomb interactions. The Boersch effect becomes stronger with increasing either the current density or the electron velocity. Therefore, where a low-energy electron beam passes through an energy filter, especially if electrons travel close to each other in passing across the focal point in the filter, the electrons affect each other, varying the energies. In this way, energy broadening occurs. This makes it difficult to obtain an electron beam having a narrow energy spread.

SUMMARY OF THE INVENTION

It is an object of the present invention to provide an energy filter capable of suppressing the Boersch effect.

It is another object of the present invention to provide an electron microscope using this energy filter.

An energy filter that achieves the first-mentioned object in accordance with the teachings of the present invention has electric and magnetic fields that are combined to pass only charged particles having a given narrow energy range. Charged particles passed through this energy filter are focused plural times (i.e., at plural focal points) in the X direction perpendicular to the direction of travel of the charged particles. The charged particles are focused in the Y direction perpendicular to the X direction at a position different from the focal points in the X direction. An energy-selecting slit is mounted at the second or subsequent focal point in the X direction.

An electron microscope, in accordance with the present invention, has an electron gun for producing an electron beam and an energy filter for passing only electrons having a given narrow energy range to a specimen. The energy filter has electric and magnetic fields that are combined to pass only electrons having the given energies. Charged particles passed through this energy filter are focused plural times (i.e., at plural focal points) in the X direction perpendicular to the direction of travel of the charged particles. The charged particles are focused in the Y direction perpendicular to the X direction at a position different from the focal points in the X direction. An energy-selecting slit is mounted at the second or subsequent focal point in the X direction.

Other objects and features of the invention will appear in the course of the description thereof, which follows.

DETAILED DESCRIPTION OF THE INVENTION

Figure 1:
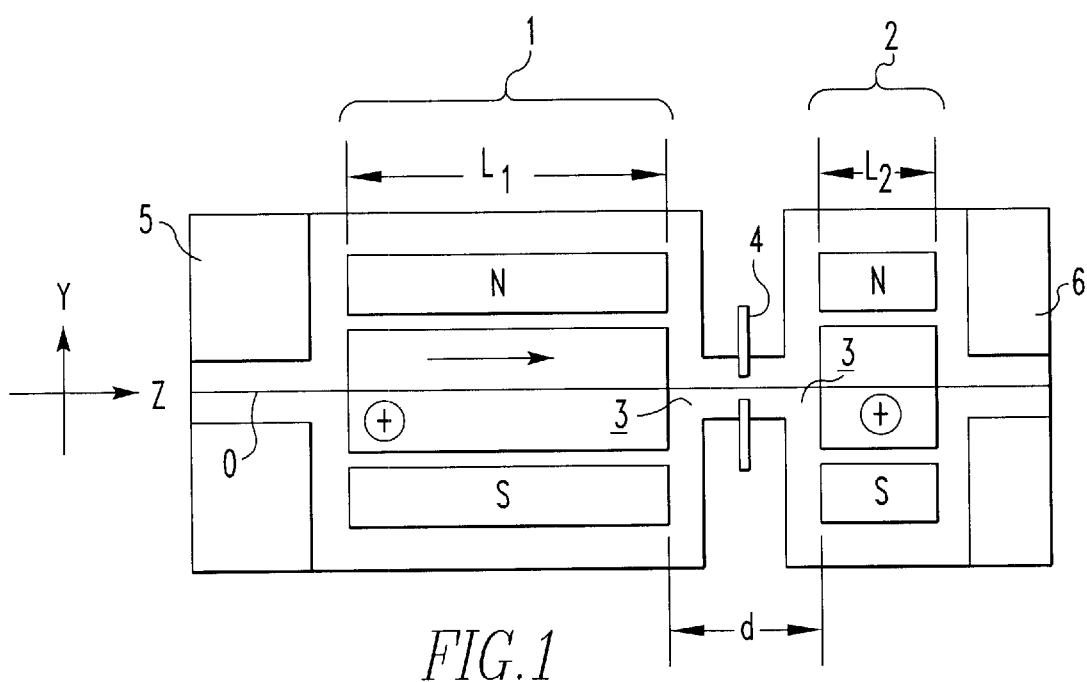
FIG. 1 is a schematic diagram of an energy filter in accordance with the present invention.

Referring to FIG. 1, there is shown an energy filter embodying the concept of the present invention. This filter comprises a first-stage filter 1 and a second-stage filter 2 that are arranged in this order along the center orbit O of an electron beam. The first-stage filter 1 and the second-stage filter 2 have lengths of $L_1$ and $L_2$, respectively. The length $L_1$ of the first-stage filter 1 is selected to be greater than the length $L_2$ of the second-stage filter 2. A free space 3 having a width of d exists between the two filters 1 and 2. An energy-selecting baffle 4 with a slit is disposed in the electron beam path within this free space 3. Shunt members 5 and 6 are mounted in the entrance and exit, respectively, of the energy filter to prevent interference of electric and magnetic fields produced by the filters 1 and 2 with surrounding electron optical components.

Figure 2:
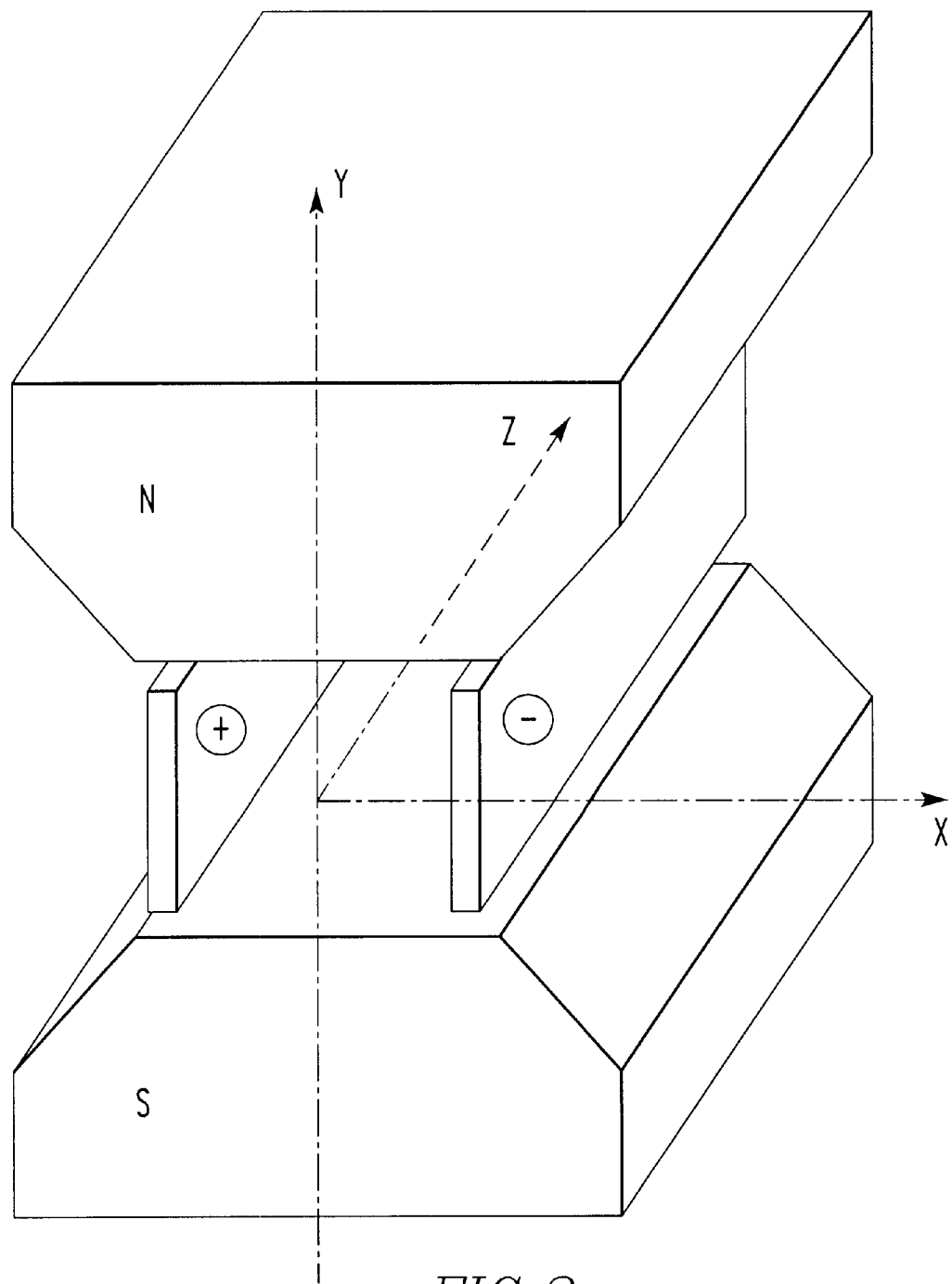
FIG. 2 is a perspective view of a Wien filter that can be used in the energy filter shown in FIG. 1.

Each of the first-stage filter 1 and the second-stage filter 2 is a Wien filter having electric and magnetic fields that are perpendicular to each other. For example, this Wien filter has a structure as shown in FIG. 2. In FIG. 2, Z indicates the optical axis of the electron beam. Magnetic poles N and S are located on the opposite sides of this optical axis. A positive electrode (+) and a negative electrode (−) are located on the opposite sides of the optical axis within the gap between the magnetic poles.

As a result, a magnetic field is produced in the Y direction and an electric field is set up in the X direction. In this way, superimposed fields are generated on and around the optical axis. Therefore, electrons incident along the optical axis follow trajectories determined by forces received from the mutually perpendicular electric and magnetic fields and by the energies possessed by individual electrons.

Figure 3A:
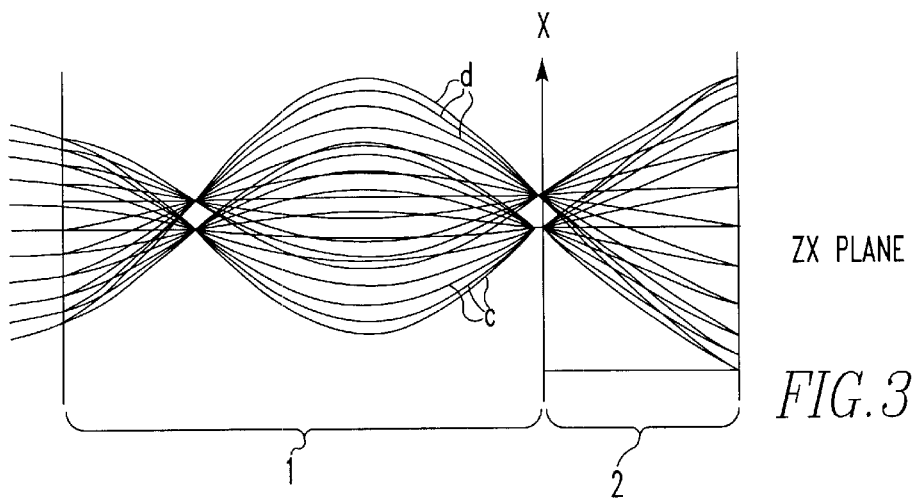
FIGS. 3(a) and 3(b) are diagrams illustrating the trajectories of electrons within the energy filter shown in FIG. 1, the trajectories being taken on the ZX- and ZY-planes, respectively.
Figure 3B:
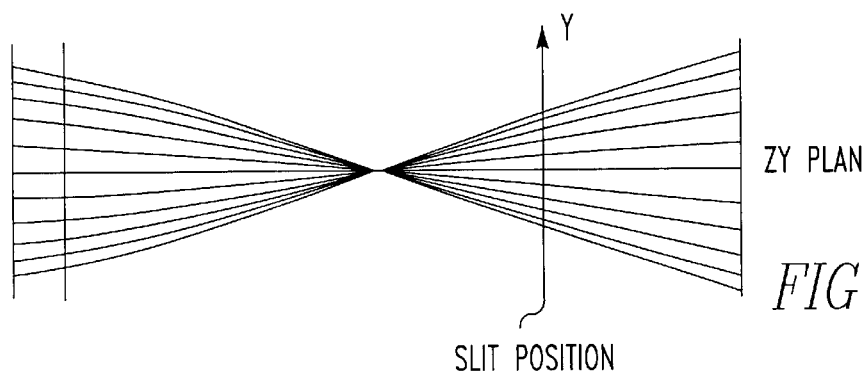

FIGS. 3(a) and 3(b) are diagrams of the trajectories of electrons within the energy filter shown in FIG. 1, the trajectories being taken on the ZX-(FIG. 3(a)) and ZY-planes (FIG. 3(b)). In FIGS. 3(a) and 3(b), it is assumed that an electron beam of circular cross section enters the first-stage filter 1 so as to be converged. The trajectories of electrons having the center energy value of the passband of the energy filter is indicated by lines c. The trajectories of electrons having energy values deviating from the center energy value by $\Delta\alpha$ are indicated by lines d.

It can be seen from FIGS. 3(a) and 3(b) that the electron beam assuming a circular cross section on entering the first-stage filter 1 is focused at two positions, i.e., around the center $L_1/2$ of the filter 1 and at the position of the slit, on the ZX-plane trajectory. On the other hand, on the ZY-plane trajectory, the beam is focused only once near the exit of the first-stage filter 1. The beam again assumes a circular cross section on entering the second-stage filter 2 and exits from the energy filter under this condition. In this way, the beam is focused at different positions between X and Y directions. This can be accomplished by appropriately selecting the magnitudes of the electric and magnetic fields forming the Wien filter.

Figure 4:
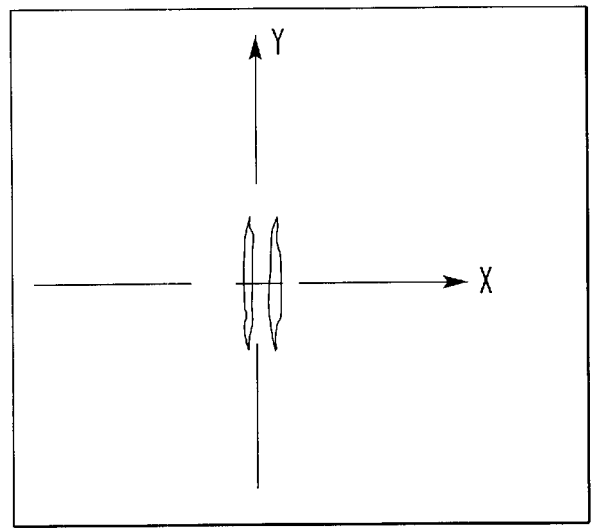
FIG. 4 is a diagram illustrating the profile of the electron beam on the plane of the slit shown in FIG. 1.

FIG. 4 shows the profile of the electron beam on the slit plane. The electron beam assumes a circular cross section on entering the first-stage filter 1. At the position of the slit, the beam assumes an elliptical or linear cross section. The dimension of the cross section taken along the X direction is small, while the dimension taken along the Y direction is larger. The beam passes across the X axis at a different position, depending on a different energy value. Accordingly, only electrons having a desired energy can be selected by the use of a slit that is elongated along the Y direction and has an appropriate width along the X direction.

We now discuss the Boersch effect on the energy filter, in accordance with the present invention, as described above. As mentioned previously, where a low-energy electron beam passes through the energy filter, especially if electrons travel close to each other in passing across a focal point in the filter, the electrons affect each other. In consequence, the energies are varied, resulting in energy spread. This makes it difficult to obtain an electron beam of a narrow energy spread. In the present embodiment, the electron beam is focused twice in the ZX-plane and once in the ZY-plane. The focal point in the ZY-plane is different from the focal points in the ZX-plane. Consequently, the beam is not converged into a spot within the filter. In particular, the beam assumes a linear, cross-sectional shape at each focal point and so the electron density is much smaller than where the beam is focused into a spot. Hence, the Boersch effect can be minimized.

In the embodiment described above, two filters are combined. More filters may be combined to constitute an energy filter in accordance with the present invention. In this case, the slit is placed in the second or subsequent focal point within the ZX-plane. Since it is difficult to place the slit within one filter, it is necessary to place the slit in the free space between two filters.

In the embodiment described above, two stages of Wien filters in which magnetic and electric fields are superimposed are used. It is not necessary that the magnetic and electric fields be perfectly superimposed. If plural stages of energy filters including a single magnetic field or a single electric field as well as superimposed fields are employed, an energy filter in accordance with the present invention can be built.

Figure 5A:
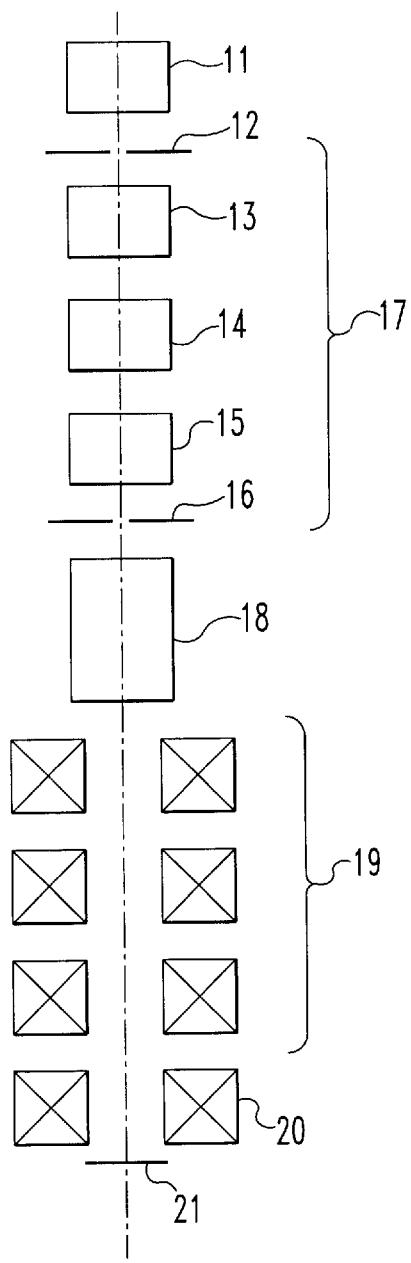
FIG. 5(a) is a schematic diagram of an electron microscope incorporating an energy filter in accordance with the present invention, the energy filter being inserted between a field emission gun and an accelerator.
Figure 5B:
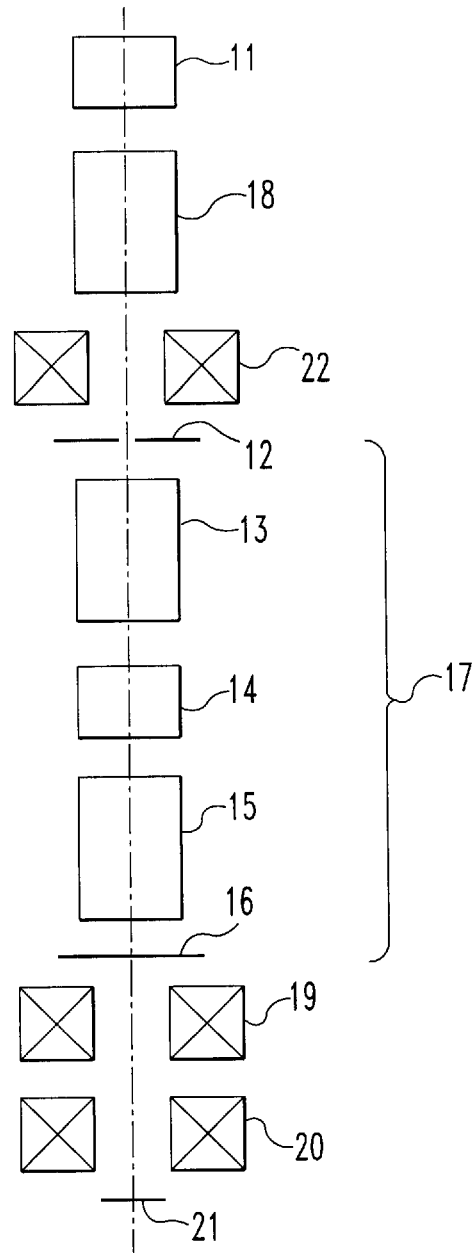
FIG. 5(b) is a diagram similar to FIG. 5(a), but in which the energy filter is inserted behind the accelerator.

FIGS. 5(a) and 5(b) show examples of the structure of an electron microscope incorporating an energy filter in accordance with the present invention. In FIG. 5(a), an energy filter in accordance with the invention is mounted between a field emission gun 11 and an accelerator. The gun 11 produces an electron beam of relatively low energies of about 1 keV to several kilovolts. The beam is admitted into a deceleration-type energy filter 17 consisting of an entrance aperture 12, a decelerating portion 13, an energy filter portion 14, an accelerating portion 15, and an exit aperture 16. In this energy filter 17, the incident electrons are decelerated to energies of hundreds of electron volts by the decelerating portion. Then, the filter portion 14 selects only electrons having a given energy (narrow band of energies). The electrons are again accelerated to the original energy by the accelerating portion 15 and then depart from the exit aperture 16. The energy filter portion 14 has the structure shown in FIG. 1.

The electron beam exiting from the exit aperture 16 is accelerated to a desired high energy (e.g., about 200 keV) by the accelerator 18. Then, the beam is made to impinge on a specimen 21 via condenser lenses 19 and an objective lens 20.

FIG. 5(b) shows an example in which an energy filter. in accordance with the present invention, is located behind an accelerator. In this example, an electron beam of relatively low energies of 1 keV to several kilovolts emitted from a field emission gun 11 is accelerated to a desired high energy (e.g., about 200 keV) by an accelerator 18. Then, the beam enters a deceleration-type energy filter 17 through a condenser lens 22. The filter 17 consists of an entrance aperture 12, a decelerating portion 13, an energy filter portion 14, an accelerating portion 15, and an exit aperture 16. In this deceleration-type energy filter 17, the incident electrons are decelerated to energies of hundreds of electron volts by the deceleration portion. Then, the filter portion 14 extracts only electrons having a given energy (narrow band of energies). The beam is accelerated to the original energy by the accelerating portion 15. Then, the beam exits from the exit aperture 16. The energy filter portion 14 assumes a structure as shown in FIG. 1. The electron beam going out of the exit aperture 16 is directed to a specimen 21 via condenser lenses 19 and an objective lens 20.

In this example, the decelerating portion 13 and the accelerating portion 15 of the deceleration-type energy filter 17 need to decelerate electrons of high energies to about hundreds of electron volts and to accelerate them to the original high energy, respectively. Therefore, the decelerating portion 13 and the accelerating portion 14 are preferably multistage electrodes similar to the native accelerator 18.

It is to be understood that the present invention is not limited to the embodiments described above and that various changes and modifications are possible. Especially, with respect to the position at which the energy filter is mounted, it is not limited to the positions used in the embodiments described above. Any appropriate position can be selected as long as it is located upstream of a specimen.

As described thus far, an energy filter, in accordance with the present invention, uses electric and magnetic fields that are combined to pass only charged particles having a given energy. The charged particles traveling through the energy filter are focused at plural positions (focal points) in the X direction perpendicular to the direction of travel. The particles are focused in the Y direction at a position different from the focal points in the X direction. An energy-selecting slit is mounted at the second or subsequent focal point in the X direction. Therefore, the energy filter in accordance with the invention and an electron microscope using it have a great advantage in reducing the Boersch effect.

Having thus described our invention with the detail and particularity required by the Patent Laws, what is desired protected by Letters Patent is set forth in the following claims.

What is claimed is:

1. An energy filter having electric and magnetic fields that are combined to pass only charged particles having a given energy range, said energy filter comprising:

means for causing the charged particles traveling through said energy filter in a direction of travel to be focused at plural focal points including a second focal point in the X direction perpendicular to the direction of travel;

means for causing the charged particles to be focused in the Y direction perpendicular to the X direction at a position different from said focal points in the X direction; and an energy-selecting slit positioned at the second or subsequent one of said focal points in the X direction.

2. The energy filter of claim 1, wherein said energy filter is composed of two energy filter portions spaced from each other, and wherein said energy-selecting slit is placed between the two energy filter portions.

3. The energy filter of claim 2, wherein each of said two energy filter portions is a Wien filter.

4. An electron microscope having an electron gun for producing an electron beam that is caused to enter a specimen via an energy filter for passing only electrons having a given energy range, said electron microscope comprising:

said energy filter consisting of a combination of an electric field and a magnetic field that are combined to pass only electrons having the given energy, said energy filter being so designed that electrons traveling through this energy filter in a direction of travel is focused at plural focal points including a second focal point in the X direction perpendicular to the direction of travel and that the electrons are focused in the Y direction perpendicular to the X direction at a position different from the focal points in the X direction; and an energy-selecting slit positioned at the second or subsequent one of said focal points in the X direction.

5. The electron microscope of claim 4, further comprising a decelerating portion for decelerating electrons incident on said energy filter and an accelerating portion for accelerating electrons exiting from said energy filter.

6. The electron microscope of claim 4 or 5, wherein said energy filter consists of two energy filter portions spaced from each other, and wherein said energy-selecting slit is positioned between said two energy filter portions.

7. The electron microscope of claim 6, wherein each of said two energy filter portions is a Wien filter.

* * * * *